(12) United States Patent
Zhang et al.

(10) Patent No.: US 10,347,629 B2
(45) Date of Patent: Jul. 9, 2019

(54) FINFET DEVICE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Cheng Long Zhang, Shanghai (CN); Hai Yang Zhang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/991,332

(22) Filed: May 29, 2018

(65) Prior Publication Data
US 2018/0294262 A1   Oct. 11, 2018

Related U.S. Application Data

(62) Division of application No. 15/483,554, filed on Apr. 10, 2017, now Pat. No. 10,008,495.

(30) Foreign Application Priority Data

Jun. 1, 2016   (CN) .......................... 2016 1 0379201

(51) Int. Cl.
*H01L 21/00*   (2006.01)
*H01L 27/088*   (2006.01)
(Continued)

(52) U.S. Cl.
CPC .... *H01L 27/0886* (2013.01); *H01L 21/76831* (2013.01); *H01L 21/76897* (2013.01);
(Continued)

(58) Field of Classification Search
CPC ......... H01L 29/66545; H01L 21/76897; H01L 27/1211; H01L 29/66795; H01L 29/785; H01L 29/0847; H01L 27/0886
See application file for complete search history.

(56) References Cited

U.S. PATENT DOCUMENTS 9,111,962 B1 * 8/2015 Alptekin ............... H01L 21/316
9,397,003 B1 * 7/2016 Niimi .............. H01L 21/823418
(Continued)

OTHER PUBLICATIONS

U.S. Appl. No. 15/483,554, Notice of Allowance, dated Mar. 9, 2018, 9 pages.
(Continued)

*Primary Examiner* — Nicholas J Tobergte
(74) *Attorney, Agent, or Firm* — Kilpatrick Townsend & Stockton LLP (57) ABSTRACT

A semiconductor device includes an active region having a doped region, a first contact member on the doped region, gate structures including a first gate structure having a first gate and a second gate structure having a second gate, the first and second gate structures being adjacent to each other and on opposite sides of the first contact member, an interlayer dielectric layer on the active region and surrounding the first and second gate structures, and the first contact member, a first insulator layer on a portion of the interlayer dielectric layer, a first contact on an upper surface of the first gate and a second contact on an upper surface of the second gate, and a second insulator layer surrounding the first and second contacts each having an upper surface lower than an upper surface of the second insulator layer.

12 Claims, 8 Drawing Sheets

(51) Int. Cl.
*H01L 21/8234* (2006.01)
*H01L 23/528* (2006.01)
*H01L 23/532* (2006.01)
*H01L 21/768* (2006.01)
*H01L 29/417* (2006.01)
*H01L 29/66* (2006.01)
*H01L 27/12* (2006.01)
*H01L 29/78* (2006.01)
*H01L 29/08* (2006.01)

(52) U.S. Cl.
CPC ........... *H01L 21/823431* (2013.01); *H01L 21/823475* (2013.01); *H01L 23/5283* (2013.01); *H01L 23/53257* (2013.01); *H01L 29/41791* (2013.01); *H01L 21/76834* (2013.01); *H01L 27/1211* (2013.01); *H01L 29/0847* (2013.01); *H01L 29/66545* (2013.01); *H01L 29/66795* (2013.01); *H01L 29/785* (2013.01)

(56) References Cited

U.S. PATENT DOCUMENTS

| | | | | |
|---|---|---|---|---|
| 9,653,364 | B1* | 5/2017 | Chang | H01L 29/785 |
| 9,853,026 | B2* | 12/2017 | Xiao | H01L 27/0886 |
| 9,985,144 | B2* | 5/2018 | Zhou | H01L 21/76895 |
| 10,008,495 | B2 | 6/2018 | Zhang et al. | |
| 2003/0216004 | A1* | 11/2003 | Jeong | H01L 21/31111 438/279 |
| 2004/0173912 | A1* | 9/2004 | Rhodes | H01L 21/76831 257/774 |
| 2007/0099363 | A1 | 5/2007 | Nakajima | |
| 2012/0313153 | A1* | 12/2012 | Zhang | H01L 29/1054 257/288 |
| 2013/0200461 | A1 | 8/2013 | Liu et al. | |
| 2015/0235948 | A1 | 8/2015 | Song et al. | |
| 2015/0243751 | A1* | 8/2015 | Liu | H01L 21/76834 257/288 |
| 2015/0270171 | A1 | 9/2015 | Basker et al. | |
| 2015/0279957 | A1* | 10/2015 | Wang | H01L 29/66795 257/401 |
| 2015/0340466 | A1* | 11/2015 | Fukuda | H01L 29/7848 257/190 |
| 2016/0005822 | A1 | 1/2016 | Song et al. | |
| 2016/0049401 | A1* | 2/2016 | Sung | H01L 27/0924 257/369 |
| 2017/0117187 | A1* | 4/2017 | Ando | H01L 21/823807 |
| 2017/0154823 | A1* | 6/2017 | Tseng | H01L 21/0228 |
| 2017/0170315 | A1* | 6/2017 | Ok | H01L 29/7845 |
| 2017/0207129 | A1* | 7/2017 | Tseng | H01L 23/535 |
| 2017/0287780 | A1* | 10/2017 | Park | H01L 21/76897 |
| 2017/0317079 | A1* | 11/2017 | Kim | H01L 21/30604 |
| 2017/0345914 | A1* | 11/2017 | Smith | H01L 21/30604 |
| 2017/0352658 | A1 | 12/2017 | Zhang et al. | |

OTHER PUBLICATIONS

European Application No. EP17173739.8, Extended European Search Report, dated Nov. 15, 2017, 9 pages.

* cited by examiner

FINFET DEVICE

CROSS-REFERENCES TO RELATED APPLICATIONS

The present application is a divisional of U.S. application Ser. No. 15/483,554, filed on Apr. 10, 2017, which claims priority to Chinese patent application No. 201610379201.6, filed with the State Intellectual Property Office of People's Republic of China on Jun. 1, 2016, the contents of which are incorporated herein by reference in their entirety.

TECHNICAL FIELD

The present disclosure relates to integrated semiconductor devices, and more particularly to a fin-type field effect transistor (FinFET) and methods for manufacturing the same.

BACKGROUND

With the advance in semiconductor technology, feature sizes of complementary metal oxide semiconductor (CMOS) devices can be scaled down to 14 nm technology node and below through incorporating high-k dielectrics in the gate stack, strain engineering techniques, pocket implants and material optimization processes. However, further scaling of planar devices presents a significant challenge due to degrading short channel effects, process variations and reliability degradation.

The technological advance of FinFET devices make it possible to further reduce the feature size of CMOS devices beyond the 14 nm node. Through a fully depleted fin, short channel effect can be controlled, random doping fluctuation can be reduced, parasitic junction capacitance can be reduced, and area efficiency can be improved.

In conventional FinFET manufacturing processes, contacts to the source, drain and gate are formed. However, in the conventional FinFET manufacturing processes, the contacts may be easily electrically connected to each other, thereby adversely affecting the device reliability.

Therefore, there is a need for improved methods of manufacturing a fin-type semiconductor device.

BRIEF SUMMARY OF THE INVENTION

Embodiments of the present disclosure provide a method for manufacturing a semiconductor device. The method may include providing a semiconductor structure comprising an active region, the active region having a first doped region, a first contact member on the first doped region, a plurality of gate structures including a first gate structure having a first gate and a second gate structure having a second gate, the first and second gate structures being adjacent to each other and on opposite sides of the first contact member, an interlayer dielectric layer on the active region and surrounding the first gate structure, the second gate structure, and the first contact member. The method may also include forming a first insulator layer on the semiconductor structure, removing a portion of the first insulator layer to form a first contact hole of the first gate and a second contact hole of the second gate, forming a second insulator layer on sidewalls of the first contact hole and sidewalls of the second contact hole, filling the first and second contact holes having the second insulator layer on the sidewalls with a first conductive material to form a first contact on a surface of the first gate and a second contact on a surface of the second gate, the first contact and the second contact each having an upper surface lower than an upper surface of the second insulator layer, forming a third insulator layer on the first contact and on the second contact covering a surface of the first contact and a surface of the second contact, selectively etching the first insulator layer on the first contact member relative to the second and third insulator layers to form a third contact hole exposing a portion of the first contact member, and filling the third contact hole with a second conductive material to form a third contact.

In an embodiment, the method may further include, after forming the third contact, planarizing the semiconductor substrate to expose the surface of the first contact and the surface of the second contact.

In an embodiment, the interlayer dielectric layer has a surface substantially flush with a surface of the first contact member.

In an embodiment, the active region is a semiconductor fin, and each of the plurality of gates structures surrounds a respective portion of the semiconductor fin.

In an embodiment, each of the first and second contact holes has a width greater than a width of the respective first and second gates.

In an embodiment, forming the second insulator layer includes forming the second insulator layer on the first insulator layer, on the sidewalls of the first and second contact holes, on the surface of the first gate and on the surface of the second gate, and removing a portion of the second insulator layer on the first insulator layer and on the surface of the first gate and on the surface of the second gate while retaining a portion of the second insulator layer on the sidewalls of the first and second contact holes.

In an embodiment, selectively etching the first insulator layer includes forming a buffer layer on the second and third insulator layers, forming a patterned mask layer on the buffer layer, etching the buffer layer and the first insulator layer using the patterned mask layer as a mask to form the third contact hole, and removing the patterned mask layer and a portion of the buffer layer.

In an embodiment, the first gate structure includes a first gate insulator on the active region and the first gate on the first gate insulator, and the second gate structure includes a second gate insulator on the active region and the second gate on the second gate insulator.

In an embodiment, the semiconductor structure further includes a second doped region and a third doped region in the active region and separated from the first doped region, a second contact member on the second doped region, and a third contact member on the third doped region. The interlayer dielectric layer includes a portion disposed between the second contact member and the first gate structure and a portion disposed between the third contact member and the second gate structure.

In an embodiment, the first insulator layer includes silicon dioxide, and the second and third insulator layers each comprise silicon nitride. The first and second conductive materials each comprise tungsten.

Embodiments of the present disclosure also provide a semiconductor device comprising a semiconductor substrate including an active region having a first doped region, a first contact member on the first doped region, a plurality of gate structures including a first gate structure having a first gate and a second gate structure having a second gate, the first and second gate structures are adjacent to each other and on opposite sides of the first contact member. The semiconductor substrate also includes an interlayer dielectric layer on the active region and surrounding the first gate structure, the second gate structure, and the first contact member; a first insulator layer on a portion of the interlayer dielectric layer; a first contact on an upper surface of the first gate and a second contact on an upper surface of the second gate; a second insulator layer surrounding the first contact and the second contact, the first and second contacts each having an upper surface lower than an upper surface of the second insulator layer; a third insulator layer on a surface of the first contact and on a surface of the second contact; and a first contact hole in the first insulator layer exposing an upper surface of the first contact member.

In an embodiment, the semiconductor structure further includes a second doped region and a third doped region in the active region and separated from the first doped region, a second contact member on the second doped region, and a third contact member on the third doped region. The interlayer dielectric layer comprises a portion disposed between the second contact member and the first gate structure and a portion disposed between the third contact member and the second gate structure. The first insulator layer includes silicon dioxide, and each of the second and third insulator layers includes silicon nitride. Each of the first contact and the second contact includes tungsten.

The following detailed description together with the accompanying drawings will provide a better understanding of the nature and advantages of the present disclosure.

DETAILED DESCRIPTION OF THE INVENTION

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" or "bottom" and "top" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "having", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

Figure 1:
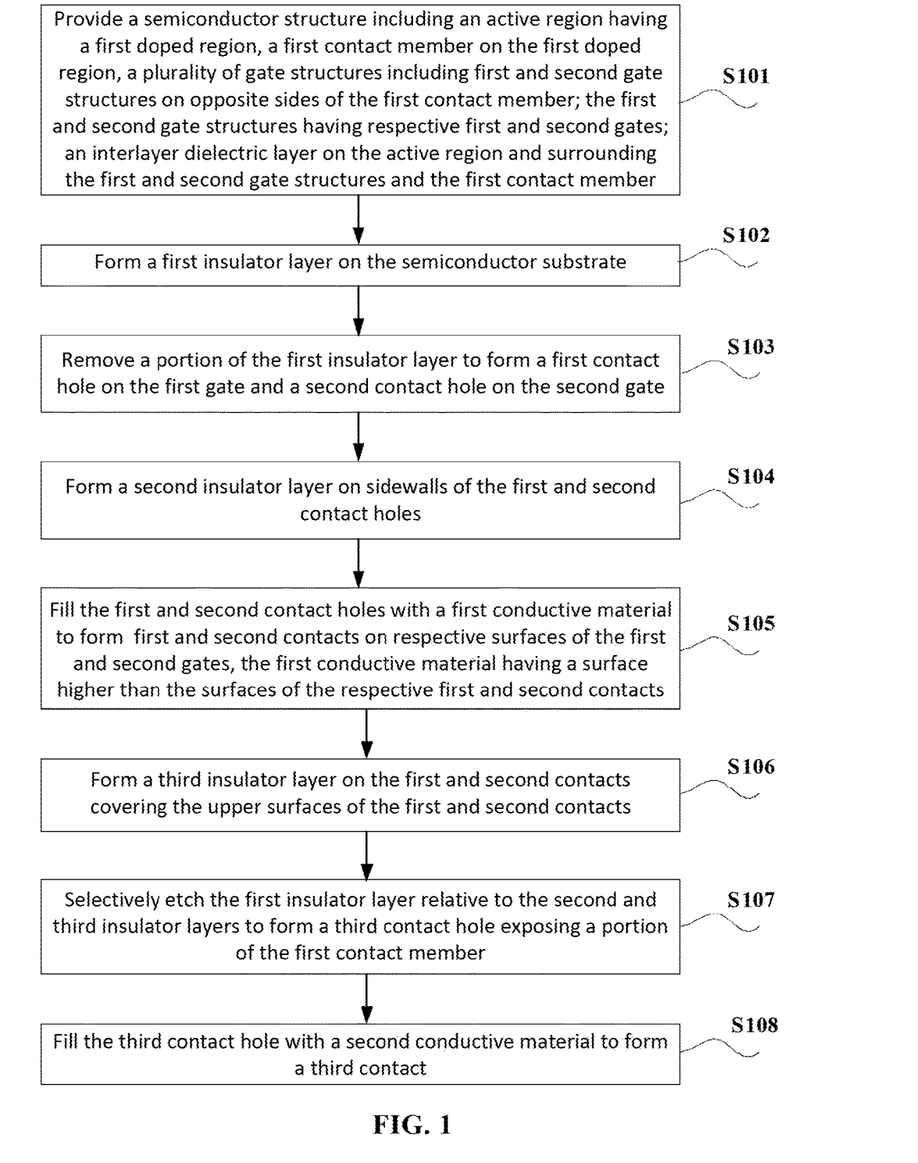
FIG. 1 is a flowchart of a method for manufacturing a semiconductor device according to some embodiments of the present disclosure.

FIG. 1 is a flowchart of a method for manufacturing a semiconductor device according to an embodiment of the present disclosure. FIG. 2 through FIG. 15 are cross-sectional views illustrating intermediate stages of a semiconductor structure in different process steps of a method of manufacturing according to embodiments of the present disclosure.

Referring to FIG. 1, the method may include providing a semiconductor structure in step S101.

Figure 2:
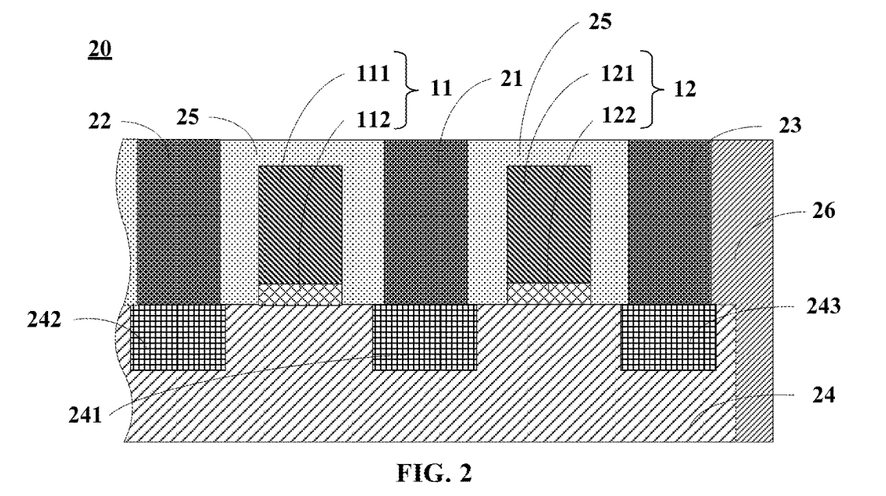
FIG. 2 is a cross-sectional view illustrating an intermediate stage of a semiconductor structure along the channel direction according to some embodiments of the present disclosure.

FIG. 2 is a cross-sectional view illustrating an intermediate stage of a semiconductor structure in step S101 according to some embodiments of the present disclosure. As shown in FIG. 2, a semiconductor structure 20 is provided. Semiconductor structure 20 may include an active region 24 including a first doped region 241. For example, first doped region 241 may be a source or a drain of a CMOS device. The material of the active region may include a semiconductor material, such as silicon. In some embodiments, active region 24 may be a semiconductor fin.

In an embodiment, referring to FIG. 2, active region 24 may include a second doped region 242 and a third doped region 243 that are separated from first doped region 241. In one exemplary embodiment, when first doped region 241 is a drain, each of second doped region 242 and third doped region 243 may be a source, i.e., two CMOS devices may be sharing a drain. In another example, when first doped region 241 is a source, each of second doped region 242 and third doped region 243 may be a drain, i.e., two CMOS devices may be sharing a source. In some embodiments, semiconductor structure 20 in FIG. 2 may be a portion of a fin-type semiconductor structure 20 (the curve line on the left of FIG. 2 indicates a section line), i.e., the active region may also include a plurality of doped regions each having a first doped region, a second doped region, and a third doped region.

In an embodiment, referring to FIG. 2, semiconductor structure 20 may further include a first contact member 21 disposed on active region 24 connected to the first doped region. For example, the first contact member may include a metal such as tungsten.

In some embodiments, referring to FIG. 2, semiconductor structure 20 may also include a second contact member 22 on active region 24 connected to second doped region 242 and a third contact member 23 on active region 24 connected to third doped region 243. For example, the second and third contact members each may include a metal such as tungsten.

In an embodiment, referring to FIG. 2, semiconductor structure 20 may further include a plurality of gate structures on active region 24. The plurality of gate structures may include at least a first gate structure 11 and a second gate structure 12 adjacent to each other. First gate structure 11 may include a first gate 111. Second gate structure 12 may include a second gate 121. The first and second gate structures are disposed on opposite sides of first contact member 21. In an exemplary embodiment, the first and second gate structures each may include polysilicon or a metal such as tungsten or aluminum.

In some embodiments, referring to FIG. 2, active region 24 may be a semiconductor fin, and the gate structures each surround a respective portion of the semiconductor fin. Note that all of the Figures (FIGS. 2 through 15) are shown in the cross-sectional views along the channel direction (longitudinal direction), and each of the gate structures surrounding a respective portion of the semiconductor fin can be understood as cross-sectional views along the traverse (i.e., perpendicular to) direction relative to the channel direction of the Figures.

In some embodiments, referring to FIG. 2, first gate structure 11 may also include a first gate insulator 112 on active region 24, and first gate 111 is on first gate insulator 112. In some embodiments, second gate structure 11 may also include a second gate insulator 122 on active region 24, and second gate 121 is on first gate insulator 122. The first and second gate insulators may include silicon dioxide.

In an embodiment, referring to FIG. 2, semiconductor structure 20 may further include an interlayer dielectric layer 25 disposed on active layer 24. Interlayer dielectric layer 25 surrounds first gate structure 11, second gate structure 12, and first contact member 21. For example, the interlayer dielectric layer may include silicon nitride.

In some embodiments, referring to FIG. 2, interlayer dielectric layer 25 includes a first portion that is disposed between second contact member 22 and first gate structure 11, and a second portion that is disposed between third contact member 23 and second gate structure 12.

In some embodiments, referring to FIG. 2, interlayer dielectric layer 25 includes a third portion that is disposed between first contact member 21 and first gate structure 11, and a fourth portion that is disposed between first contact member 21 and second gate structure 12.

In some embodiments, interlayer dielectric layer 25 has an upper surface that is substantially flush with the upper surface of first contact member 21.

In an embodiment, referring to FIG. 2, semiconductor structure 20 may further include a fourth insulator layer 26 disposed around active region 24, interlayer dielectric layer 25 and the respective contact members (e.g., first contact member 21, second contact member 22, and third contact member 23). In an exemplary embodiment, fourth insulator layer 26 may include silicon dioxide.

Referring back to FIG. 1, a first insulator layer is formed on the semiconductor structure in step S102.

Figure 3:
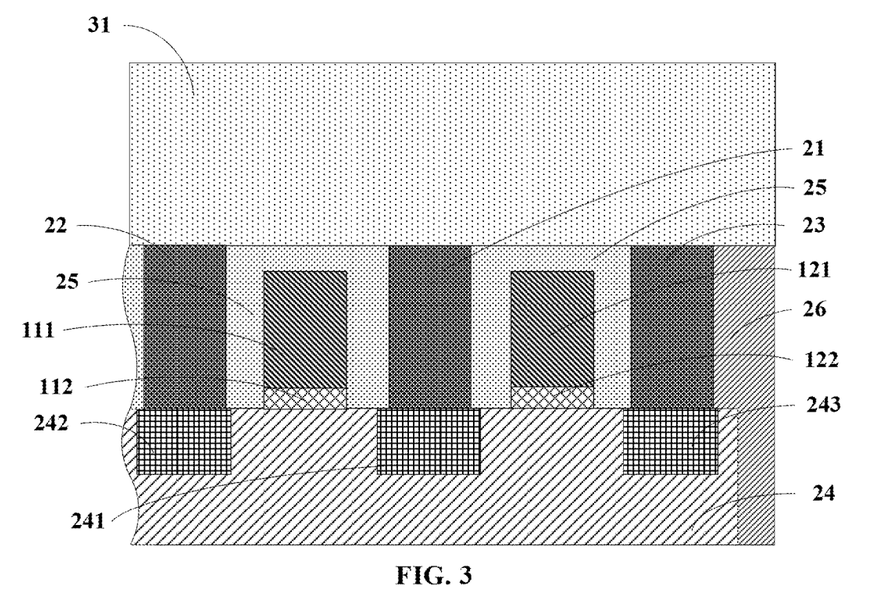
FIG. 3 is a cross-sectional view illustrating an intermediate stage of a semiconductor structure along the channel direction according to some embodiments of the present disclosure.

FIG. 3 is a cross-sectional view of an intermediate stage of a semiconductor structure in step S102 according to some embodiments of the present disclosure. As shown in FIG. 3, a first insulator layer 31 may be formed on semiconductor structure 20 using a deposition process. In some embodiments, the first insulator layer may include silicon dioxide.

In some embodiments, referring to FIG. 3, first insulator layer 31 has a portion formed on fourth insulator layer 26.

Referring back to FIG. 1, a portion of the first insulator layer is removed to form a first contact hole exposed a surface of the first gate and a second contact hole exposing a surface of the second gate in step S103.

Figure 4:
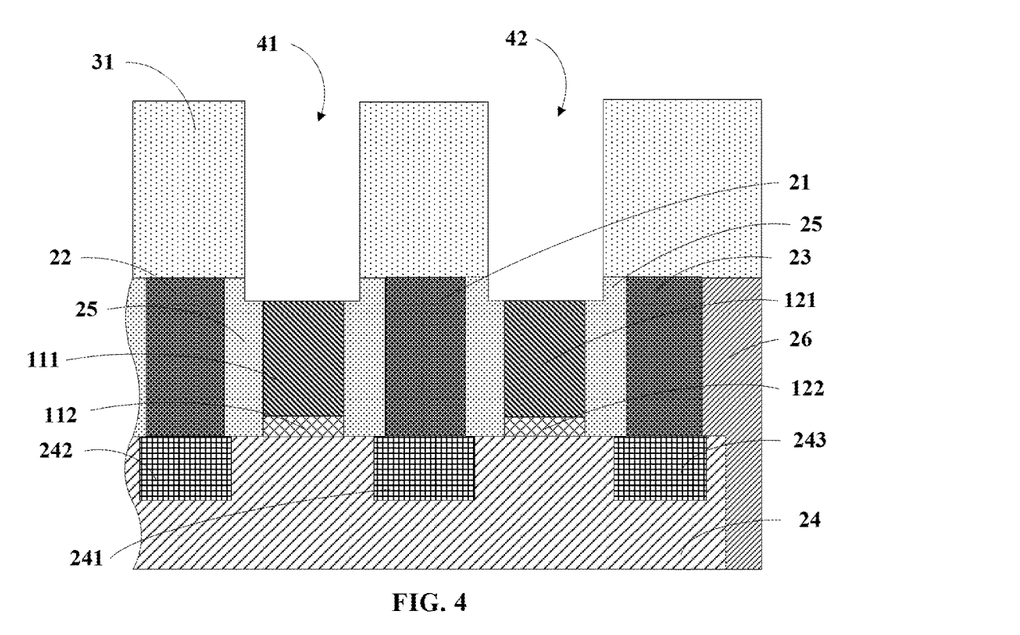
FIG. 4 is a cross-sectional view illustrating an intermediate stage of a semiconductor structure along the channel direction according to some embodiments of the present disclosure.

FIG. 4 is a cross-sectional view of an intermediate stage of a semiconductor structure in step S103 according to some embodiments of the present disclosure. As shown in FIG. 4, a portion of the first insulator layer may be removed using an etching process and with a patterned mask, e.g., a photoresist (not shown) to form a first contact hole 41 exposed an surface of first gate 111 and a second contact hole 42 exposing a surface of the second gate 121. In some embodiments, the etching process may also remove a portion of interlayer dielectric layer 25 to expose the entire upper surface of the first gate and the entire upper surface of the second gate.

In some embodiments, the first and second contact holes each have a lateral dimension or size (e.g., width) larger than the lateral dimension (e.g., width) of the corresponding gates. For example, as shown in FIG. 4, the width of the first contact hole 41 is larger than the width of first gate 111, and the width of the second contact hole 42 is larger than the width of second gate 121. In another example, when forming the contact holes, the width of first and second holes are made 10% larger than the target width, which is the width of the first gate or the width of the second gate.

In some embodiments, in step S103, the width of the contact hole is equal to the target width+2 times the thickness of an atomic layer deposited insulator layer. Herein, the target width is the lateral dimension (width) of the first gate or the width of the second gate, and the atomic layer deposition thickness refers to the thickness of the layer by atomic layer deposition (ALD) in a subsequent epitaxial growth step, e.g., a second insulator layer described in detail below.

Referring back to FIG. 1, in step S104, a second insulator layer is formed on sidewalls of the first contact hole and the second contact hole.

Figure 6:
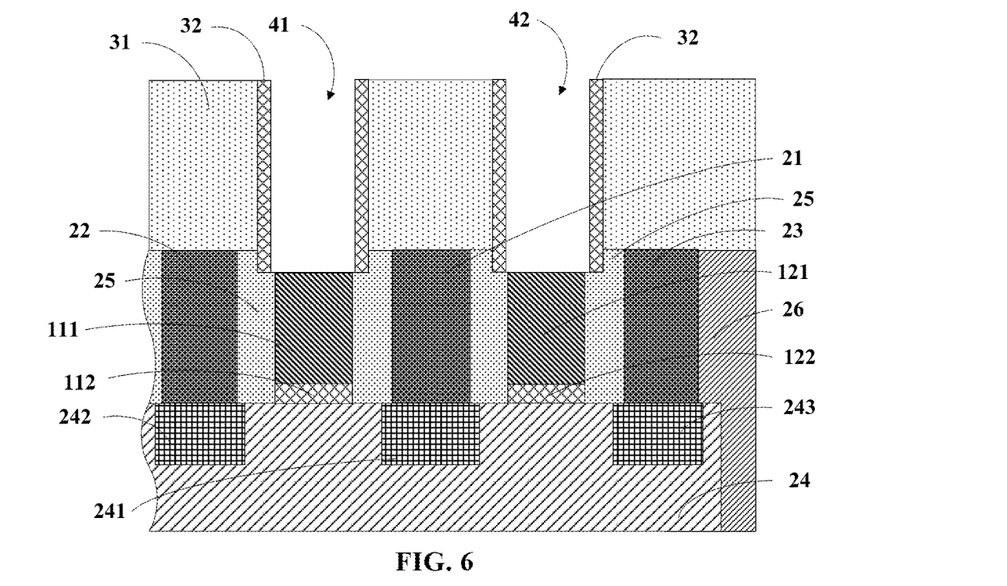
FIG. 6 is a cross-sectional view illustrating an intermediate stage of a semiconductor structure along the channel direction according to some embodiments of the present disclosure.

FIG. 6 is a cross-sectional view of an intermediate stage of a semiconductor structure in step S104 according to some embodiments of the present disclosure. As shown in FIG. 6, a second insulator layer 32 is formed on sidewalls of first contact hole 41 and second contact hole 42. In some embodiments, the second insulator layer may include silicon nitride.

Figure 5:
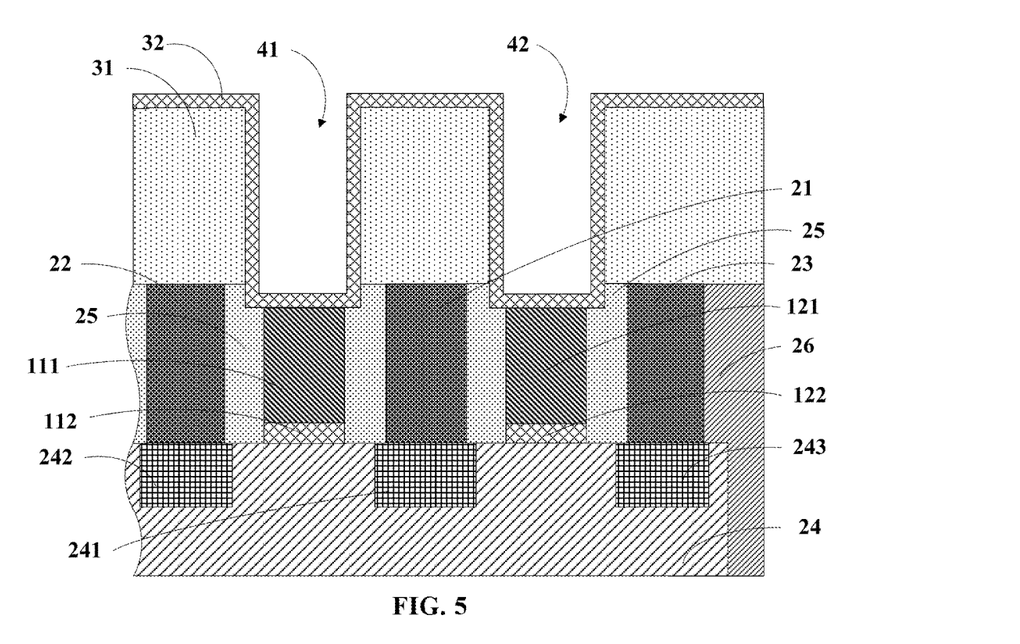
FIG. 5 is a cross-sectional view illustrating an intermediate stage of a semiconductor structure along the channel direction according to some embodiments of the present disclosure.

In an embodiment, as shown in FIG. 5, step S104 may include forming second insulator layer 32 on first insulator layer 31, sidewalls of first contact hole 41 and second contact hole 42, and upper (top) surfaces of first gate 111 and second gate 121. For example, the second insulator layer may be formed using an atomic layer deposition (ALD) process.

In some embodiments, referring to FIG. 5, when the width of the first contact hole and the width of the second contact hole are larger than the widths of the corresponding contact members, a second insulator layer may also be formed on a removed portion of etched interlayer dielectric layer 25 at the bottom of the contact holes (e.g., first and second contact holes 41, 42).

In other embodiments, when the width of the first contact hole and the width of the second contact hole are not larger than (i.e., less than or equal to) the widths of the corresponding contact members, i.e., a portion of interlayer dielectric layer 25 at the bottom of the contact hole is not etched, the second insulator layer is not formed on interlayer dielectric layer 25.

In an embodiment, referring to FIG. 6, step S104 may also include removing a portion of second insulator layer 32 on the upper surface of first insulator layer 31, a portion of second insulator layer 32 on the upper surface of first gate 111, and a portion of second insulator layer 32 on the upper surface of second gate 121, while retaining the portion of second insulator layer 32 on the sidewalls of first contact hole 41 and second contact hole 42. For example, an anisotropic etch process may be used to remove an undesired portion of the second insulator layer while retaining a desired portion of the second insulator layer on the sidewalls of the first and second contact holes.

Referring back to FIG. 1, in step S105, after forming the second insulator layer, a first conductive material is filled in the first and second contact holes to form a first contact on the upper surface of the first gate and a second contact on the upper surface of second gate, so that the upper surface of the first contact and the upper surface of the second contact are lower than the upper surface of the second insulator layer. For example, the first conductive material may include a metal such as tungsten.

Figure 8:
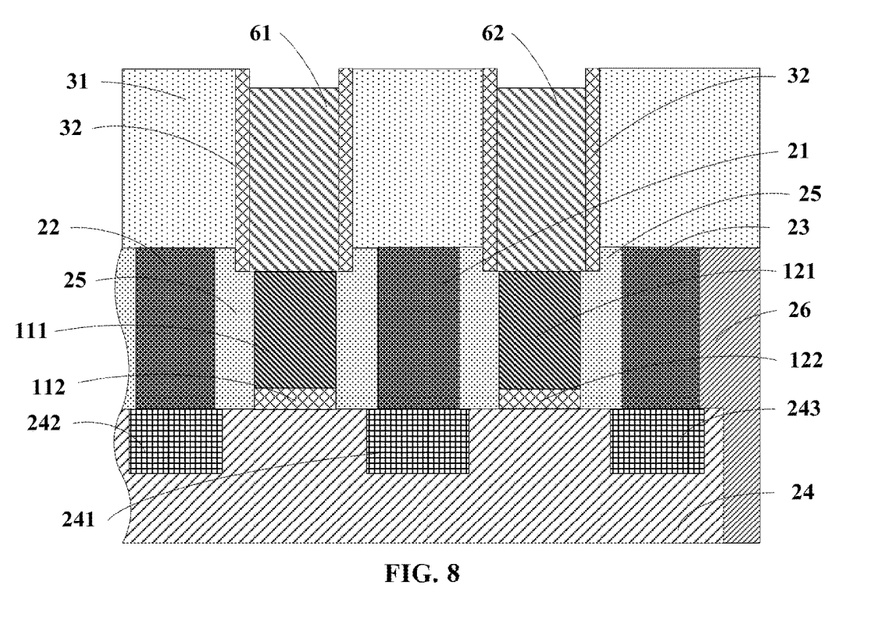
FIG. 8 is a cross-sectional view illustrating an intermediate stage of a semiconductor structure along the channel direction according to some embodiments of the present disclosure.

FIG. 8 is a cross-sectional view of an intermediate stage of a semiconductor structure in step S105 according to some embodiments of the present disclosure. As shown in FIG. 8, after forming the second insulator layer, a first conductive material is filled in first contact hole 41 and second contact hole 42 to form a first contact 61 on the upper surface of first gate 111 and a second contact 62 on the upper surface of second gate 121, so that the upper surface of first contact 61 and the upper surface of second contact 62 are lower than the upper surface of second insulator layer 32.

Figure 7:
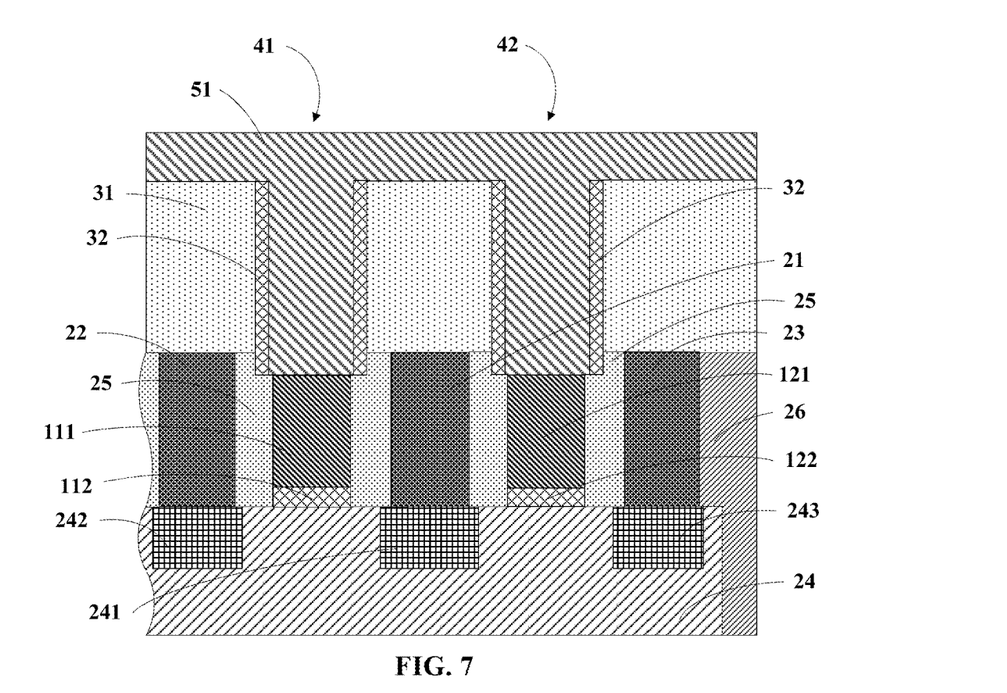
FIG. 7 is a cross-sectional view illustrating an intermediate stage of a semiconductor structure along the channel direction according to some embodiments of the present disclosure.

In an embodiment, referring to FIG. 7, step S105 may include forming a first conductive material 51 on the semiconductor structure filling first contact hole 41 and second contact hole 42.

In an embodiment, referring to FIG. 8, step S105 may further include performing an etch process on first conductive material 51 to form first contact 61 on the upper surface of first gate 111 and second contact 62 on the upper surface of second gate 121, so that the upper surface of first contact 61 and the upper surface of second contact 62 are lower than the upper surface of second insulator layer 32.

Referring back to FIG. 1, in step S106, a third insulator layer is formed on the first contact and the second contact to cover the surface of the first contact and the surface of the second contact.

Figure 9:
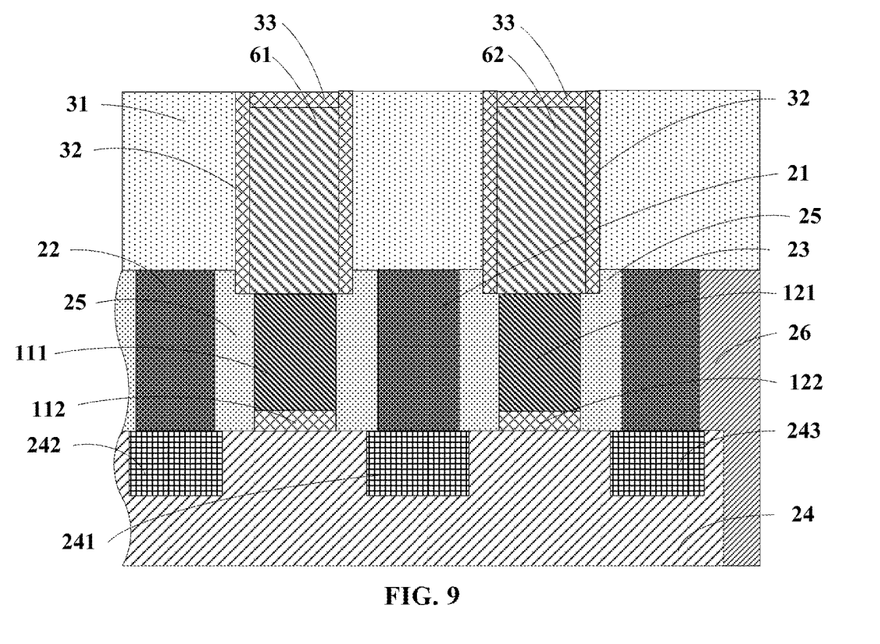
FIG. 9 is a cross-sectional view illustrating an intermediate stage of a semiconductor structure along the channel direction according to some embodiments of the present disclosure.

FIG. 9 is a cross-sectional view of an intermediate stage of a semiconductor structure in step S106 according to some embodiments of the present disclosure. As shown in FIG. 9, a third insulator layer 33 is formed on first contact 61 and second contact 62 covering the surfaces of the first and second contacts. For example, a third insulator layer may be formed on the semiconductor structure shown in FIG. 8, and a planarization process is performed on the third insulator layer to form third insulator layer 33, as shown in FIG. 9. In some embodiments, the third insulator layer may include silicon nitride.

Referring back to FIG. 1, in step S107, the first insulator layer on the first contact is selectively etched with respect to the second insulator layer and the third insulator layer to form a third contact hole to expose a portion of the first contact member. In some embodiments, step S107 may also include forming a fourth contact hole exposing a portion of the second contact member and a fifth contact hole exposing a portion of the third contact member.

Figure 10:
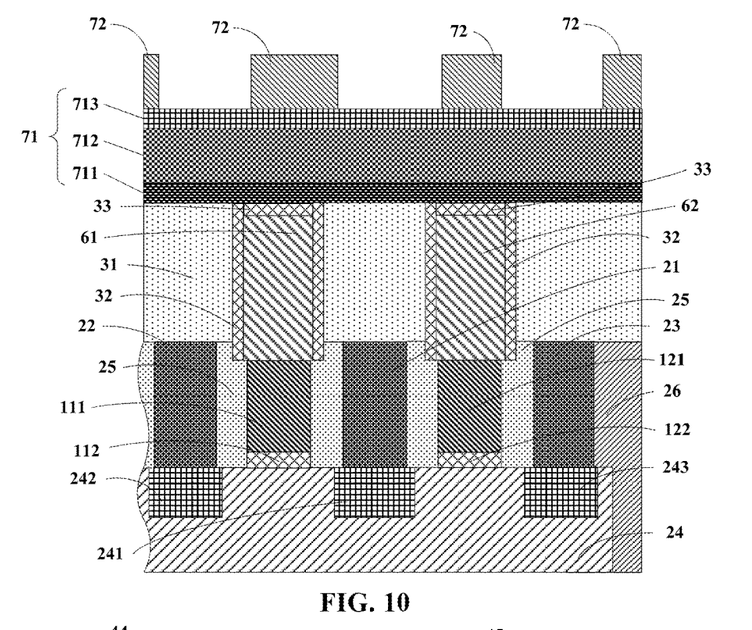
FIG. 10 is a cross-sectional view illustrating an intermediate stage of a semiconductor structure along the channel direction according to some embodiments of the present disclosure.

In some embodiments, referring to FIG. 10, step S107 may further include forming a buffer layer 71 on first insulator layer 31, second insulator layer 32, and third insulator layer 33. Step S107 also includes forming a patterned mask layer (e.g., photoresist) 72 on buffer layer 71. In some embodiments, buffer layer 71 may include one or more layers. For example, the buffer layer may include silicon-containing anti-reflection coating (SiARC) layer and an organic under-layer (ODL) resist layer, or a bottom anti-reflective coating (BARC) layer, or a BARC layer, low temperature oxide (LTO) layer and amorphous carbon (a-C) layer. As shown in FIG. 10, buffer layer 71 may include a first buffer layer (a-C) 711 on first insulator layer 31, second insulator layer 32, and third insulator layer 33, a second buffer (e.g., LTO) layer 712, and a third buffer (e.g., BARC) layer 713.

Figure 11:
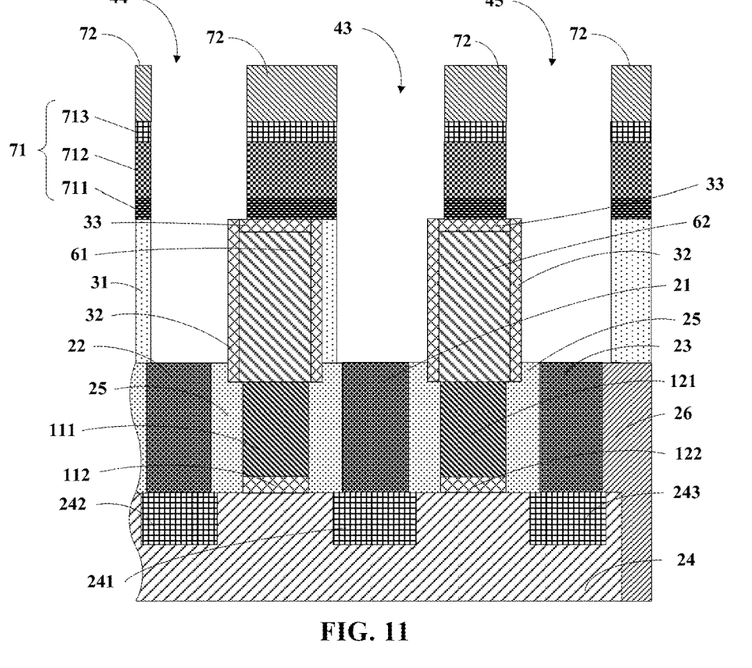
FIG. 11 is a cross-sectional view illustrating an intermediate stage of a semiconductor structure along the channel direction according to some embodiments of the present disclosure.

In an embodiment, referring to FIG. 11, step S107 may further include performing an etch process on buffer layer 71 and first insulator layer 31 using patterned mask layer 72 as a mask to form a third contact hole 43. The etch process step has high selectivity. For example, the material of the first insulator layer may be silicon dioxide, and the material of the second and third insulator layers may be silicon nitride. The selective etch process may be performed, for example, using an etchant that can substantially etch silicon dioxide without reacting with silicon nitride. For example, a diluted hydrofluoric acid solution (the ratio of water to HF is in the range between 500:1 and 2,000:1) may be used as the etchant solution.

In some embodiments, referring to FIG. 11, buffer layer 71 and first insulator layer 31 may be etched using patterned mask layer 72 as a mask to form a fourth contact hole 44 exposing a portion of second contact member 22 and a fifth fourth contact hole 45 exposing a portion of third contact member 23.

Figure 12:
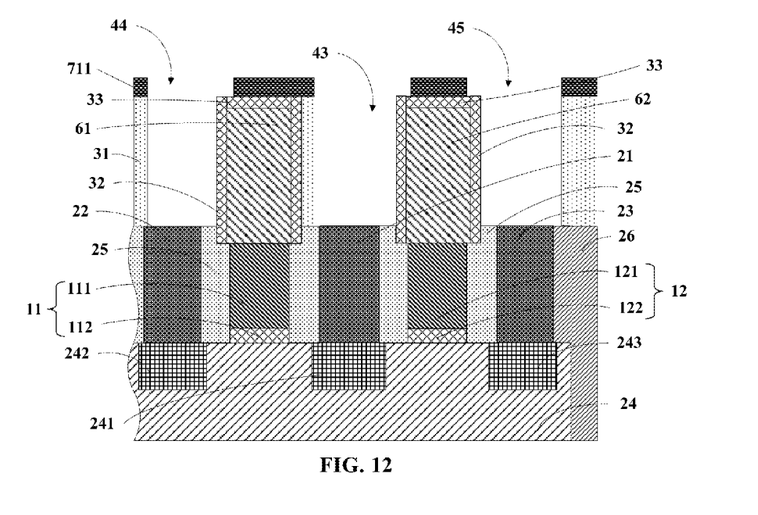
FIG. 12 is a cross-sectional view illustrating an intermediate stage of a semiconductor structure along the channel direction according to some embodiments of the present disclosure.

In an embodiment, step S107 may also include removing a portion of the mask layer and a portion of the buffer layer. Referring to FIG. 12, patterned mask layer 72 is removed and a portion of buffer layer 71 is removed. For example, second buffer layer 712 and third buffer layer 713 are removed while first buffer layer 711 is retained. In another example, patterned mask layer 72 and buffer layer 71 are completely removed. In the exemplary embodiment used below, patterned mask layer 72, second buffer layer 712 and third buffer layer 713 are removed in the description of subsequent steps.

Referring back to FIG. 1, in step S108, the third contact hole is filled with a second conductive material to form a third contact. In some embodiments, the method may include filling the fourth contact hole and the fifth contact hole to form a fourth contact and a fifth contact. The second conductive material may include a metal such as tungsten.

Figure 13:
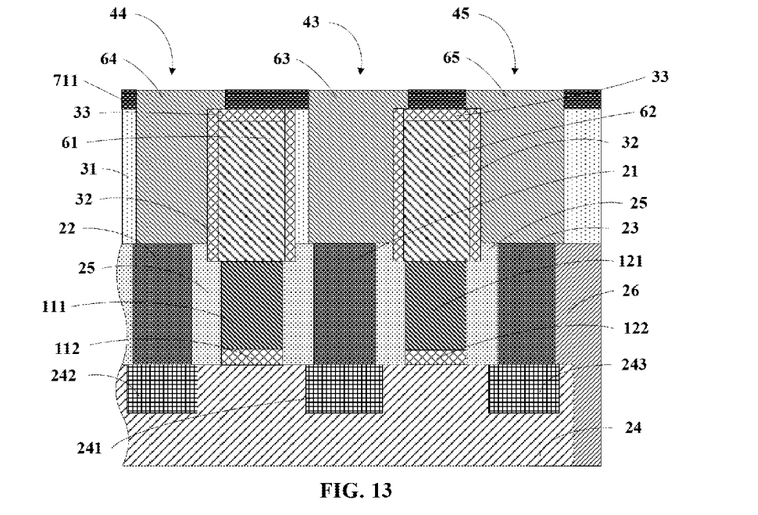
FIG. 13 is a cross-sectional view illustrating an intermediate stage of a semiconductor structure along the channel direction according to some embodiments of the present disclosure.

FIG. 13 is a cross-sectional view of an intermediate stage of a semiconductor structure in step S108 according to some embodiments of the present disclosure. As shown in FIG. 13, third contact hole 43 is filled with the second conductive material to form a third contact 63. In some embodiments, fourth contact hole 44 is filled with the second conductive material to form a fourth contact 64. In some embodiments, fifth contact hole 45 is filled with the second conductive material to form a fifth contact 65. In some embodiments, the third, fourth, and fifth contact holes are filled with the second conductive material at the same time.

Figure 14:
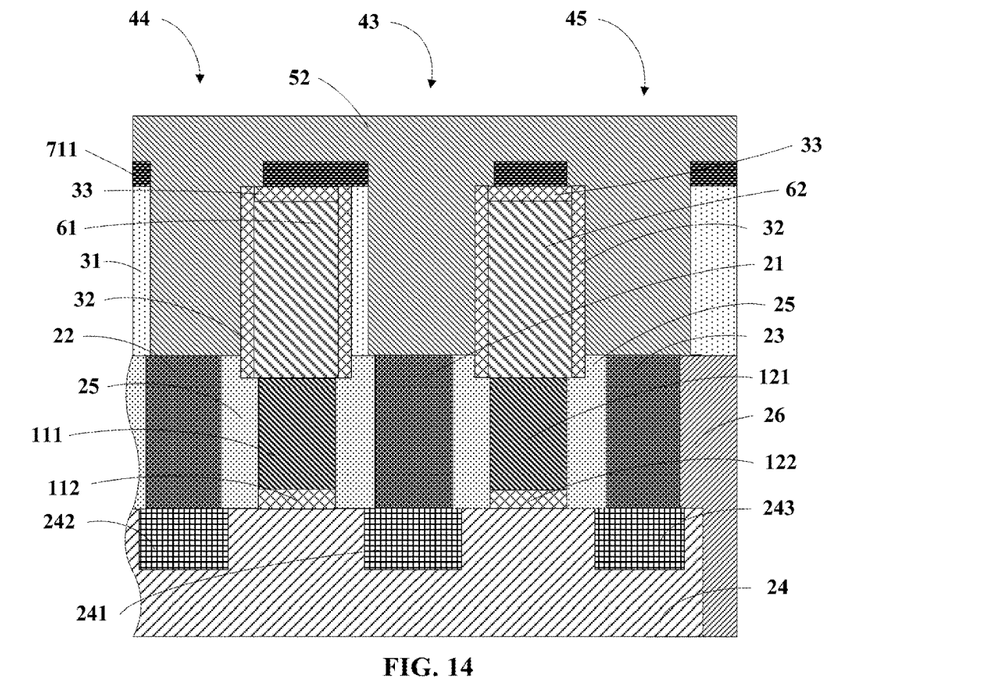
FIG. 14 is a cross-sectional view illustrating an intermediate stage of a semiconductor structure along the channel direction according to some embodiments of the present disclosure.
Figure 15:
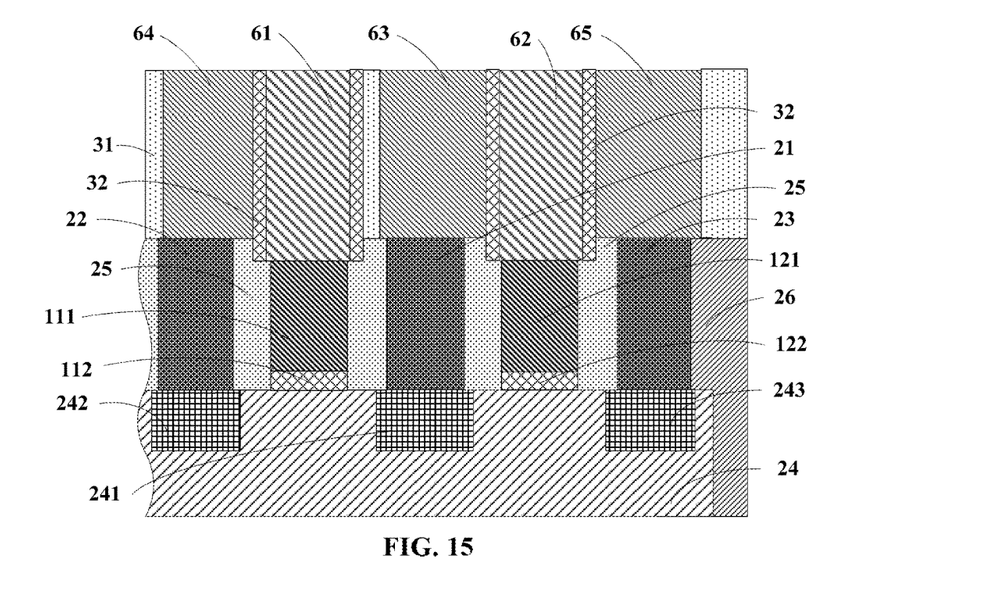
FIG. 15 is a cross-sectional view illustrating an intermediate stage of a semiconductor structure along the channel direction according to some embodiments of the present disclosure.

FIG. 14 is a cross-sectional view of an intermediate stage of a semiconductor structure in step S108 according to other embodiments of the present disclosure. As shown in FIG. 14, in other embodiments, a second conductive material 52 is deposited on the semiconductor structure shown in FIG. 12 filling third contact hole 43. In some embodiments, second conductive material 52 also fills fourth contact hole 44 and fifth contact hole 45.

Thus, embodiments of the present disclosure provide a method of manufacturing a semiconductor device.

In some embodiments of the present disclosure, the method may further include performing a planarization (e.g., using a chemical mechanical polishing) process after the formation of the contacts to expose a surface of the contacts, e.g., the upper surfaces of first contact 61 and second contact 62. For example, the method includes planarizing the semiconductor structure in FIG. 13 or FIG. 14 to expose the surfaces of the first and second contacts.

In accordance with the present disclosure, the method of manufacturing a semiconductor device can prevent unintended connections between contacts. For example, the method of the present disclosure can prevent an electrical connection between first contact 61 of first gate 111 and third contact 63 of contact member 21, and prevent an electrical connection between third contact 63 of contact member 21 and second contact 62 of second gate 121, thereby improving the device reliability.

In some embodiments, the method not only can be applied to the manufacturing of FinFET devices, but also can be applied to planar devices. Thus, the scope of the present disclosure is not limited to FinFET devices.

Embodiments of the present disclosure may also provide a semiconductor device. For example, referring to FIG. 12, the semiconductor device may include an active region 24 including a first doped region 241. For example, the first doped region may be a source or a drain of a CMOS device. The active region may include a semiconductor material, e.g., silicon. In some embodiments, active region 24 may be a semiconductor fin.

In some embodiments, active region 24 may include a second doped region 242 and a third doped region 243 separated from first doped region 241. In one embodiment, first doped region 241 is a drain, each of second doped region 242 and third doped region 243 is a source, i.e., the semiconductor device includes two CMOS devices sharing a single source. In another embodiment, first doped region 241 is a source, each of second doped region 242 and third doped region 243 is a drain, i.e., the semiconductor device includes two CMOS devices sharing a single drain. In some embodiments, the semiconductor device of FIG. 12 may be a portion of a fin-type semiconductor structure, i.e., the active region may include a plurality of doped regions each including the first, second, and third doped regions.

In an embodiment, referring to FIG. 12, the semiconductor device may further include a first contact member 21 of first doped region 241 on active region 24. The first contact member may include a metal such as tungsten.

In some embodiments, referring still to FIG. 12, the semiconductor device may also include second contact member 22 on second doped region 242 and third contact member 23 on third doped region 243. The second contact and third contact members each may include a metal such as tungsten.

In an embodiment, referring still to FIG. 12, the semiconductor device may further include a plurality of gate structures on active region 24. The plurality of gate structures include at least first gate structure 11 and second gate structure 12 adjacent to each other. First gate structure 11 may include a first gate 111. Second gate structure 12 may include a second gate 121. First gate structure 11 and second gate structure 12 are disposed on opposite sides of first contact member 21. The first and second gate structures may include polysilicon or metals such as tungsten, aluminum and the like.

In some embodiments, referring still to FIG. 12, active region 24 may be a semiconductor fin, and each of the gate structures surrounds a portion of the semiconductor fin.

In some embodiments, referring still to FIG. 12, first gate structure 11 may also include a first gate insulator 112 on active region 24. First gate 111 is on first gate insulator 112. In some embodiments, second gate structure 12 may also include a second gate insulator 122 on active region 24. Second gate 121 is on second gate insulator 122. The first and second gate insulators each may include silicon dioxide.

In some embodiments, referring still to FIG. 12, the semiconductor device may also include an interlayer dielectric layer 25 on active region, interlayer dielectric layer 25 surrounds first gate structure 11, second gate structure 12, and first contact member 21. The interlayer dielectric layer may include silicon nitride.

In some embodiments, referring still to FIG. 12, interlayer dielectric layer 25 has a portion disposed between second contact member 22 and first gate structure 11 and a portion disposed between third contact member 23 and second gate structure 12.

In some embodiments, referring still to FIG. 12, interlayer dielectric layer 25 has a portion disposed between first contact member 21 and first gate structure 11 and a portion disposed between first contact member 21 and second gate structure 12.

In some embodiments, referring still to FIG. 12, interlayer dielectric layer 25 has an upper surface flush with the upper surface of first contact member 21.

In an embodiment, referring still to FIG. 12, the semiconductor device may also include a contact 61 on the upper surface of first gate 111, and a second contact 62 on the upper surface of second gate 121.

In some embodiments, first contact 61 and second contact 62 each have a width greater than the widths of the corresponding gates. For example, the width of first contact 61 is greater than the width of first gate 111, and the width of second contact 62 is greater than the width of second gate 121, as shown in FIG. 12.

In some embodiments, the first and second contacts each include a metal such as tungsten.

In an embodiment, referring still to FIG. 12, the semiconductor device may further include a second insulator layer 32 surrounding sidewalls of first contact 61 and second contact 62. First contact 61 and second contact 62 each have an upper surface lower than the upper surface of second insulator layer 32. The second insulator layer includes silicon nitride.

In an embodiment, referring still to FIG. 12, the semiconductor device may also include a third insulator layer 33 covering the upper surfaces of first contact 61 and second contact 62.

The third insulator layer includes silicon nitride.

In an embodiment, referring still to FIG. 12, the semiconductor device may also include a first insulator layer 31 on interlayer dielectric layer 25 and surrounding at least a portion of second insulator layer 32 and at least a portion of third insulator layer 33. First insulator layer 31 has a third contact hole 43 that exposes at least a surface portion of first contact member 21. The first insulator layer includes silicon dioxide.

In some embodiments, first insulator layer 31 also has a fourth contact hole 44 that exposes at least a surface portion of second contact 22 and a fifth contact hole 45 that exposes at least a surface portion of third contact 23.

In an embodiment, referring still to FIG. 12, the semiconductor device may also include a fourth insulator layer 26 surrounding active region 24, interlayer dielectric layer 25 and contact members 21, 21, and 23. First insulator layer 31 has a portion disposed on fourth insulator layer 26. The fourth insulator layer may include silicon dioxide.

In an embodiment, referring still to FIG. 12, the semiconductor device may also include a buffer layer 711 disposed on first insulator layer 31, second insulator layer 32, and third insulator 33.

According to some embodiments of the present disclosure, contacts can be formed in corresponding contact holes that have no electrical connections with each other, thereby improving the device reliability.

Thus, embodiments of the present disclosure provide a detailed description of a method of manufacturing a semiconductor device and a semiconductor device manufactured by the described method. Details of well-known processes are omitted in order not to obscure the concepts presented herein.

It is to be understood that the above described embodiments are intended to be illustrative and not restrictive. Many embodiments will be apparent to those of skill in the art upon reviewing the above description. The scope of the disclosure should, therefore, be determined not with reference to the above description, but instead should be determined with reference to the appended claims along with their full scope of equivalents.

What is claimed is:
1. A semiconductor device, comprising:
    a semiconductor substrate comprising an active region including a first doped region;
    a first contact member on the first doped region;
    a plurality of gate structures including a first gate structure having a first gate and a second gate structure having a second gate, the first and second gate structures being adjacent to each other and on opposite sides of the first contact member;
    an interlayer dielectric layer on the active region and surrounding the first gate structure, the second gate structure, and the first contact member, the interlayer dielectric layer having an upper surface flush with an upper surface of the first contact member;
    a first insulator layer on a portion of the interlayer dielectric layer;
    a first contact on an upper surface of the first gate and a second contact on an upper surface of the second gate;
    a second insulator layer surrounding the first contact and the second contact, the first contact and the second contact each having an upper surface lower than an upper surface of the second insulator layer;
    a third insulator layer on a surface of the first contact and on a surface of the second contact; and
    a first contact hole in the first insulator layer exposing an upper surface of the first contact member.

2. The semiconductor device of claim 1, wherein the active region is a semiconductor fin, and each of the plurality of gate structures surrounds a respective portion of the semiconductor fin.

3. The semiconductor device of claim 1, wherein the first contact hole has a width greater than a width of the respective first and second gates.

4. The semiconductor device of claim 1, wherein the first gate structure further comprises a first gate insulator on the active region and the first gate on the first gate insulator, and the second gate structure further comprises a second gate insulator on the active region and the second gate on the second gate insulator.

5. The semiconductor device of claim 1, wherein the first doped region is a source or a drain.

6. The semiconductor device of claim 1, wherein the semiconductor substrate further comprises:
 a second doped region and a third doped region in the active region and separated from the first doped region;
 a second contact member on the second doped region and a third contact member on the third doped region,
 wherein the interlayer dielectric layer comprises a portion disposed between the second contact member and the first gate structure and a portion disposed between the third contact member and the second gate structure.

7. The semiconductor device of claim 1, wherein the first insulator layer comprises silicon dioxide, and the second and third insulator layers each comprise silicon nitride.

8. The semiconductor device of claim 1, wherein each of the first contact and the second contact comprises tungsten.

9. The semiconductor device of claim 1, wherein the first contact hole has a width equal to a sum of a width of the first gate and 2 times a thickness of the second insulator layer.

10. The semiconductor device of claim 1, wherein the third insulator layer has an upper surface flush with an upper surface of the second insulator layer.

11. The semiconductor device of claim 1, wherein the first contact member is continuously formed on the first doped region.

12. The semiconductor device of claim 1, wherein the upper surface of the first contact member is higher than an upper surface of the plurality of gate structures.

* * * * *